United States Patent
Fujiwara et al.

(10) Patent No.: US 11,088,685 B2
(45) Date of Patent: Aug. 10, 2021

(54) HIGH-FREQUENCY SWITCH

(71) Applicant: MITSUBISHI ELECTRIC CORPORATION, Tokyo (JP)

(72) Inventors: Takanobu Fujiwara, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 74 days.

(21) Appl. No.: 16/616,849

(22) PCT Filed: Jul. 3, 2017

(86) PCT No.: PCT/JP2017/024359
§ 371 (c)(1),
(2) Date: Nov. 25, 2019

(87) PCT Pub. No.: WO2019/008639
PCT Pub. Date: Jan. 10, 2019

(65) Prior Publication Data
US 2021/0175882 A1     Jun. 10, 2021

(51) Int. Cl.
*H03K 17/16*     (2006.01)

(52) U.S. Cl.
CPC .................. *H03K 17/161* (2013.01)

(58) Field of Classification Search
CPC .................................. H03K 17/161
USPC ....................................... 327/581
See application file for complete search history.

(56) References Cited

U.S. PATENT DOCUMENTS

| 6,094,088 | A | 7/2000 | Yano |
| 7,928,794 | B2 * | 4/2011 | Balboni ............ H03K 17/04106 327/427 |
| 8,008,970 | B1 | 8/2011 | Homol et al. |
| 2001/0007430 | A1 * | 7/2001 | Goodell ............ H03K 17/04123 327/308 |
| 2006/0267666 | A1 | 11/2006 | Toda |
| 2008/0258799 | A1 * | 10/2008 | Teraguchi ............ H03K 17/693 327/427 |
| 2012/0256678 | A1 | 10/2012 | Sun et al. |

FOREIGN PATENT DOCUMENTS

| CN | 1033812483 A | 5/2014 |
| JP | 10-242826 A | 9/1998 |
| JP | 2964975 B2 | 10/1999 |
| JP | 2001-217701 A | 8/2001 |

(Continued)

OTHER PUBLICATIONS

Japanese Office Action for Japanese Application No. 2019-528206, dated Dec. 3, 2019, with an English translation.

(Continued)

*Primary Examiner* — Tomi Skibinski
(74) *Attorney, Agent, or Firm* — Birch, Stewart, Kolasch & Birch, LLP

(57) ABSTRACT

An NMOS transistor performs electrical conduction or cut-off between a drain and a source by controlling a potential at a gate. A resistive element is connected between a back gate of the NMOS transistor and a high-frequency ground. A first switching circuit is disposed in parallel with the resistive element between the back gate and the high-frequency ground and causes a short circuit between the back gate and the high-frequency ground upon cut-off.

4 Claims, 3 Drawing Sheets

(56) References Cited

FOREIGN PATENT DOCUMENTS

| JP | 2006-332416 A | 12/2006 |
| JP | 2008-153385 A | 7/2008 |
| JP | 2008-270964 A | 11/2008 |
| WO | WO 2008/036047 A | 3/2008 |

OTHER PUBLICATIONS

Extended European Search Report, dated Jun. 15, 2020, for European Application No. 17916875.2.
European Communication pursuant to Article 94(3) EPC for corresponding European Application No. 17916875.2, dated Mar. 16, 2021.
International Search Report for PCT/JP2017/024359 dated Sep. 19, 2017.

* cited by examiner

HIGH-FREQUENCY SWITCH

TECHNICAL FIELD

The present invention relates to a high-frequency switch using a semiconductor switch.

BACKGROUND ART

For a high-frequency switch used in a radio communication device, there is known a high-frequency switch using a field effect transistor (FET) which is manufactured by a triple-well process. The basic operation of the high-frequency is such that a signal between a source and a drain is used to switch between conduction and cut-off states by applying a control voltage to a gate.

When a high-frequency signal is applied to the high-frequency switch, a voltage at the source or drain changes over time on the basis of the amplitude of the input signal. At this time, when the gate or a back gate is biased at a fixed potential, Vgs (source-gate voltage) or Vgb (back gate-gate voltage) of the FET changes over time due to a change in voltage at the source or drain, which is a cause of signal distortion. Hence, conventionally, there is a configuration in which a resistive element is disposed between a gate or a back gate and a high-frequency ground (see, for example, Patent Literature 1). By the resistive element, the gate or back gate has open-circuit impedance in high frequency, and by parasitic capacitance between the gate or back gate and source or drain of the FET itself, a potential at the gate or back gate can follow fluctuations over time in source or drain potential. As a result, the Vgs and Vgb become constant, thereby avoiding signal distortion.

CITATION LIST

Patent Literature

Patent Literature 1: JP 10-242826 A

SUMMARY OF INVENTION

Technical Problem

However, in the above-described conventional high-frequency switch, the gate and back gate of the FET have open-circuit impedance not only upon conduction but also upon cut-off. Therefore, there is a problem in that, upon cut-off, a signal inputted from the source (or the drain) leaks to the drain (or the source) through the parasitic capacitance, degrading isolation upon cut-off.

The invention is made to solve such a problem, and an object of the invention is to provide a high-frequency switch capable of suppressing signal leakage through a gate and a back gate upon cut-off.

Solution to Problem

A high-frequency switch according to the invention includes a transistor including a drain, a source, a gate, and a back gate, the transistor performing electrical conduction or cut-off between the drain and the source by controlling a voltage at the gate, a resistive element disposed between the back gate and a high-frequency ground; and a first switching circuit for causing a short circuit between the back gate and the high-frequency ground upon the cut-off, the first switching circuit being disposed in parallel with the resistive element between the back gate and the high-frequency ground, wherein the transistor comprises an NMOS transistor, and the first switching circuit is formed using a parasitic diode formed at a junction surface between an N-well and the back gate, the N-well being used to perform electrical cut-off between a semiconductor substrate and the back gate of the NMOS transistor; and a control voltage source to control a bias potential of the parasitic diode.

Advantageous Effects of Invention

The high-frequency switch according to the invention includes the first switching circuit that is disposed in parallel with the resistive element between the back gate and the high-frequency ground, and causes a short circuit between the back gate and the high-frequency ground upon cut-off. By this, signal leakage through the gate and back gate upon the cut-off can be suppressed.

DESCRIPTION OF EMBODIMENTS

To describe the invention in more detail, modes for carrying out the invention will be described below with reference to accompanying drawings.

First Embodiment

Figure 1:
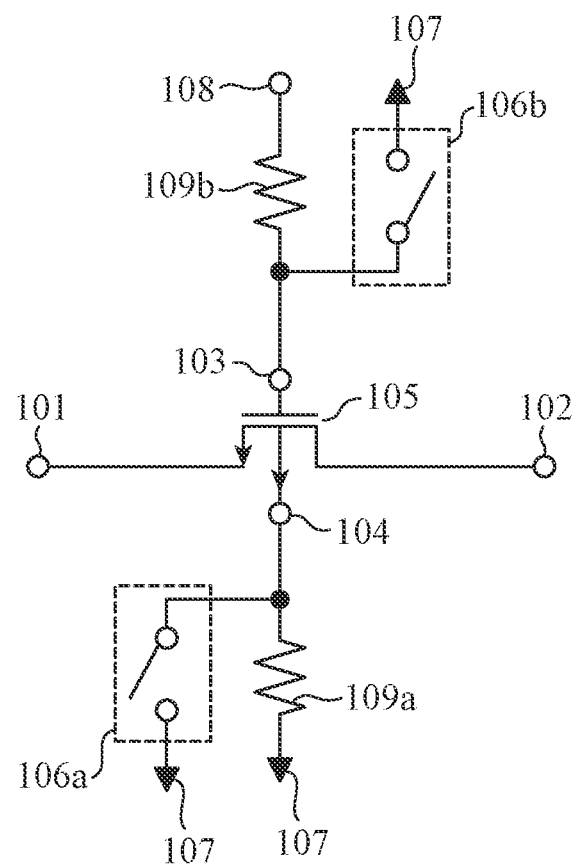
FIG. 1 is a configuration diagram showing a high-frequency switch of a first embodiment of the invention.

FIG. 1 is a configuration diagram of a high-frequency switch of the present embodiment.

The high-frequency switch of the present embodiment includes an NMOS transistor 105 having a source 101, a drain 102, a gate 103, and a back gate 104; resistive elements 109b and 109a for biasing the gate 103 and the back gate 104; and a first switching circuit 106a and a second switching circuit 106b. The gate 103 is connected to a gate control terminal 108 through the resistive element 109b, and the back gate 104 is connected to a high-frequency ground 107 through the resistive element 109a. The first switching circuit 106a is connected in parallel with the resistive element 109a between the back gate 104 and the high-frequency ground 107. The second switching circuit 106b is connected in parallel with the resistive element 109b between the gate 103 and the high-frequency ground 107.

The NMOS transistor 105 which is most widely used as a high-frequency switch performs electrical conduction or cut-off (which is hereinafter referred to as "conduction state" or "cut-off state") between the source 101 and the drain 102 by an applied voltage to the gate 103. An applied voltage to the gate control terminal 108 is applied to the gate 103 of the NMOS transistor 105 through the resistive element 109b which is a bias resistor, and when the applied voltage exceeds a threshold value of the NMOS transistor 105, the NMOS transistor 105 goes into a "conduction state". In contrast, when the applied voltage to the gate 103 is less than or equal to the threshold value, the NMOS transistor 105 goes into a "cut-off state". In general, the applied voltage to the gate 103 is set to the maximum voltage (hereinafter referred to as High) of the transistor in the "conduction state", and set to a ground potential (hereinafter, referred to as Low) in the "cut-off state".

Next, the operation of the first switching circuit 106a and the second switching circuit 106b will be described. The first switching circuit 106a and the second switching circuit 106b allow the back gate 104 and the gate 103 to have open-circuit impedance in the "conduction state", and allow the back gate 104 and the gate 103 to have short-circuit impedance in the "cut-off state".

A reason that electrical isolation (hereinafter, simply referred to as isolation) between the source 101 and the drain 102 in the "cut-off state" can be improved by the first switching circuit 106a and the second switching circuit 106b will be described. Even in the "cut-off state", for example, an input signal from the source 101 leaks to the drain 102 via parasitic capacitance of the NMOS transistor 105 itself and a node of the gate 103 or the back gate 104. This is a cause of low isolation in the "cut-off state" of a conventional high-frequency switch. However, in the present embodiment, an input signal from the source 101 or the drain 102 in the "cut-off state" can be allowed to escape to the high-frequency ground 107 via the first switching circuit 106a and the second switching circuit 106b. As a result, the isolation in the "cut-off state" can be improved.

Next, a specific configuration of the first switching circuit 106a and the second switching circuit 106b will be described.

Figure 2:
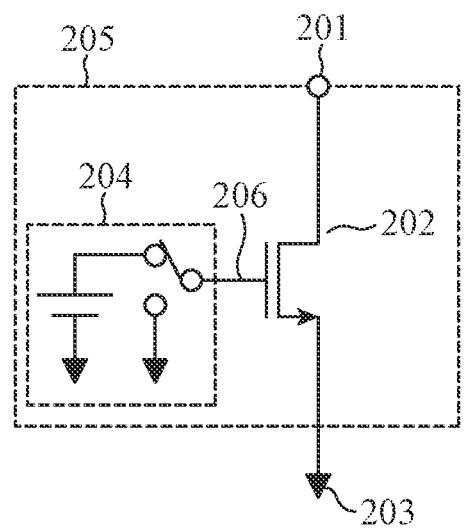
FIG. 2 is a configuration diagram showing details of a switching circuit of the high-frequency switch of the first embodiment of the invention.

The first switching circuit 106a and the second switching circuit 106b can be implemented by, for example, a switching circuit 205 using an NMOS transistor 202, such as that shown in FIG. 2. A gate 206 of the NMOS transistor 202 is controlled by a control voltage source 204. The back gate 104 and the gate 103 in FIG. 1 are connected to a terminal 201. The terminal 201 is connected to a drain of the NMOS transistor 202, and a source of the NMOS transistor 202 is connected to a high-frequency ground 203. In the "cut-off state", High is applied to the gate 206 of the NMOS transistor 202 from the control voltage source 204 to short-circuit the terminal 201 to the high-frequency ground 203. In the "conduction state", Low is applied to the gate 206 from the control voltage source 204, by which the terminal 201 has open-circuit impedance.

Figure 3:
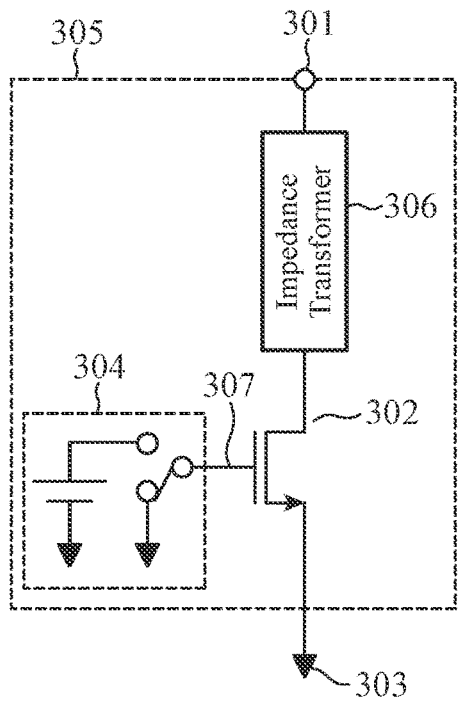
FIG. 3 is a configuration diagram showing details of another example of a switching circuit of the high-frequency switch of the first embodiment of the invention.

In addition, as another example, the first switching circuit 106a and the second switching circuit 106b can also be implemented by a switching circuit 305 using an NMOS transistor 302 and an impedance transformer 306 for a desired frequency, such as that shown in FIG. 3. The impedance transformer 306 is connected between a terminal 301 and a drain of the NMOS transistor 302, and a source of the NMOS transistor 302 is connected to a high-frequency ground 303. In addition, a control voltage source 304 is connected to a gate 307 of the NMOS transistor 302 so as to apply a voltage to the gate 307.

This circuit configuration is effective when the NMOS transistor 302 needs to be disposed at a location physically away from the NMOS transistor 105 which is used for signal conduction. In this configuration, the operation of the control voltage source 304 differs from that of the control voltage source 204 described in FIG. 2, and an output voltage is reversed between High and Low. In the "cut-off state", Low is applied to the gate 307 from the control voltage source 304, and in the "conduction state", High is applied to the gate 307 from the control voltage source 304. Although the operating state of the NMOS transistor 302 is reversal from that of the example of FIG. 2, since the impedance transformer 306 further reverses impedance at the terminal 301 (i.e., the back gate 104 and the gate 103) between a short-circuit and an open-circuit, desired operation is performed.

The purpose of the first switching circuit 106a and the second switching circuit 106b is to short-circuit the gate 103 and the back gate 104 to the high-frequency ground 107 in the "cut-off state", and multiple configurations that perform the same operation are considered, and thus, the configuration of the first switching circuit 106a and the second switching circuit 106b is not limited to the configurations shown in FIGS. 2 and 3.

As described above, the high-frequency switch according to the first embodiment includes a transistor that has a drain, a source, a gate, and a back gate and performs electrical conduction or cut-off between the drain and the source by controlling a voltage at the gate; a resistive element disposed between the back gate and a high-frequency ground; and a first switching circuit that is disposed in parallel with the resistive element between the back gate and the high-frequency ground, and causes a short circuit between the back gate and the high-frequency ground upon the cut-off, and thus, signal leakage through the gate and the back gate upon the cut-off can be suppressed.

In addition, the high-frequency switch according to the first embodiment includes a second switching circuit that is disposed between the gate and the high-frequency ground and causes a short circuit between the gate and the high-frequency ground upon the cut-off, and thus, isolation upon the cut-off can be further improved.

Second Embodiment

Figure 4:
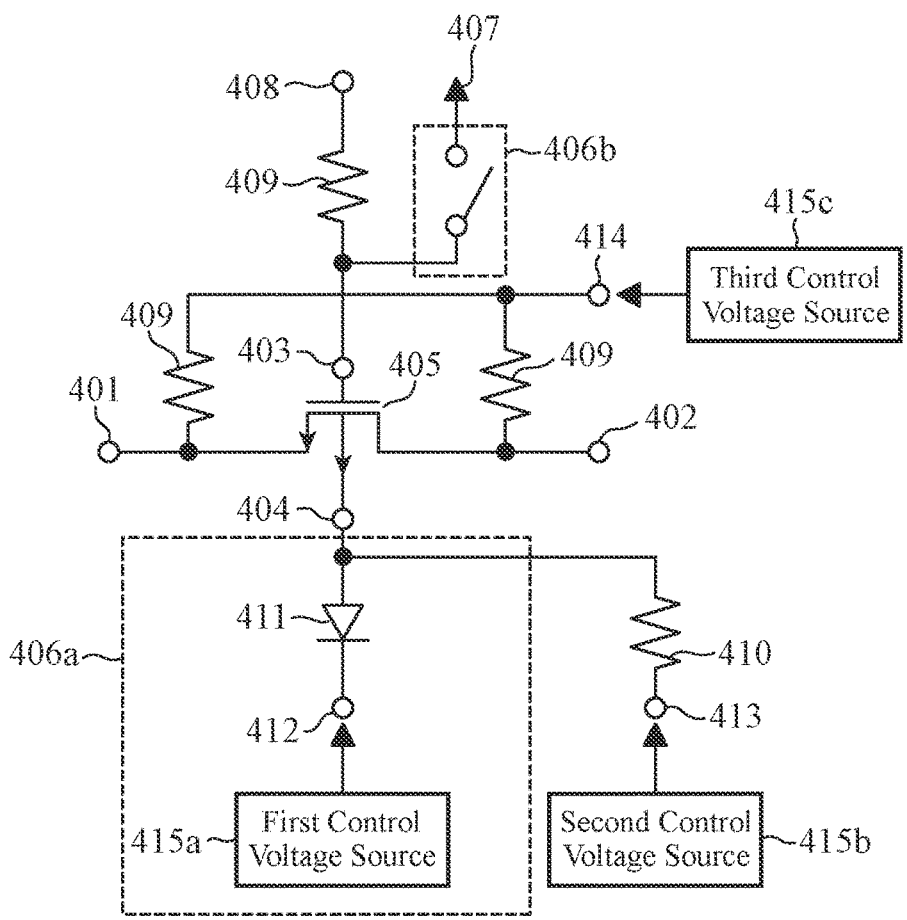
FIG. 4 is a configuration diagram showing a high-frequency switch of a second embodiment of the invention.
Figure 5:
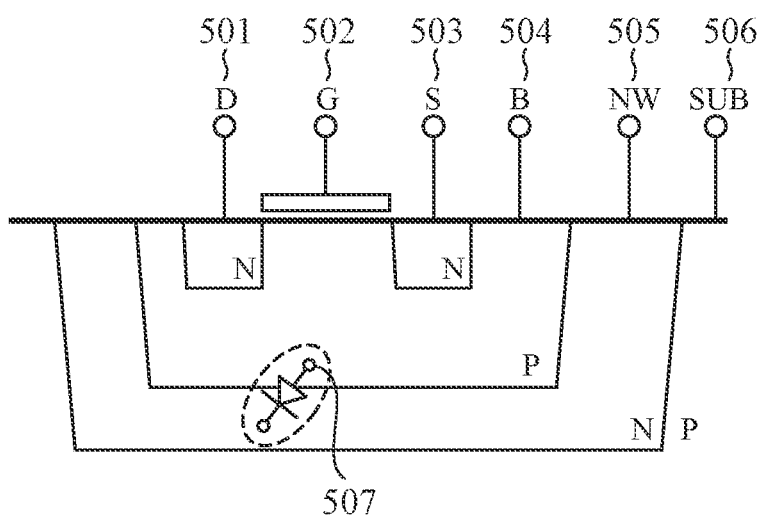
FIG. 5 is a cross-sectional view of an NMOS transistor of the high-frequency switch of the second embodiment of the invention.

FIG. 4 is a configuration diagram of a high-frequency switch according to a second embodiment. FIG. 5 is a cross-sectional view of a transistor of the high-frequency switch of the second embodiment.

The high-frequency switch of the second embodiment includes an NMOS transistor 405 having a source 401, a drain 402, a gate 403, and a back gate 404; a resistive element 409 for biasing the gate 403; and a first switching circuit 406a and a second switching circuit 406b. Here, the NMOS transistor 405 having the source 401, the drain 402, the gate 403, and the back gate 404 is the same as the NMOS transistor 105 having the source 101, the drain 102, the gate 103, and the back gate 104 of the first embodiment. In addition, the resistive element 409 and a gate control terminal 408 which are connected to the gate 403 are the same as the resistive element 109b and the gate control terminal 108 of the first embodiment.

In addition, the first switching circuit 406a of the second embodiment is formed using a parasitic diode 411 of the NMOS transistor 405. Namely, the first switching circuit 406a includes the parasitic diode 411 whose anode side is connected to the back gate 404; a bias potential control terminal 412 connected to a cathode side of the parasitic diode 411; and a first control voltage source 415a connected to the bias potential control terminal 412. In addition, a bias potential control terminal 413 is disposed on the anode side of the parasitic diode 411 through a resistive element 410, and a second control voltage source 415b is connected to the bias potential control terminal 413. Note that the second switching circuit 406b of the second embodiment is formed in the same manner as the second switching circuit 106b of the first embodiment, but may be formed in the same manner as the first switching circuit 406a.

Furthermore, in the second embodiment, a bias potential control terminal (source-drain bias control terminal) 414 is provided to the source 401 and the drain 402 through resistive elements 409, and a third control voltage source (source-drain bias control voltage source) 415c is connected to the bias potential control terminal 414. Note that the resistance values of the resistive element 409 connected between the bias potential control terminal 414 and the source 401, the resistive element 409 connected between the bias potential control terminal 414 and the drain 402, and the resistive element 409 connected between the gate 403 and the gate control terminal 408 are equal to each other, but may be made different from each other as appropriate on the basis of a design condition.

Next, the NMOS transistor 405 will be described using FIG. 5.

The NMOS transistor 405 includes a drain 501, a source 503, and an N-well 505 for back gate separation which serve as an N-type semiconductor; and a back gate 504, a common silicon substrate 506, and a gate 502 for channel control which serve as a P-type semiconductor. A parasitic diode 507 formed at a PN junction surface between the back gate 504 and the N-well 505 corresponds to the parasitic diode 411 in FIG. 4. In addition, a relationship between other configurations and the configurations of FIG. 4 is as follows. Specifically, the drain 501 of FIG. 5 corresponds to the drain 402, the gate 502 to the gate 403, the source 503 to the source 401, the back gate 504 to the back gate 404, and the N-well 505 to the bias potential control terminal 412, respectively.

Next, the operation of the high-frequency switch of the second embodiment will be described.

In the second embodiment, in the "cut-off state", in order to short-circuit the back gate 404 to the high-frequency ground, the parasitic diode 411 is used. The second control voltage source 415b is connected to the anode side of the parasitic diode 411 through the resistive element 410 for biasing, and the cathode side is connected to the first control voltage source 415a. Therefore, by the first control voltage source 415a and the second control voltage source 415b setting forward bias or reverse bias on the parasitic diode 411, the parasitic diode 411 (the parasitic diode 507 of FIG. 5) can be electrically short-circuited or open-circuited.

In the "cut-off state", by forward-biasing the parasitic diode 411, a short circuit is caused between the back gate 404 and the first control voltage source 415a. Since the first control voltage source 415a is a voltage source and has low output impedance, a signal having leaked from the source 401 or the drain 402 to the back gate 404 can escape to the first control voltage source 415a. In contrast, in the "conduction state", by reverse-biasing the parasitic diode 411, the back gate 404 and the first control voltage source 415a can be electrically separated from each other. Therefore, a signal having leaked from the source 401 or the drain 402 to the back gate 404 does not escape to the first control voltage source 415a. As a result, degradation in passage loss of the high-frequency switch can be prevented.

Next, an example of voltage application to the bias potential control terminal 412 by the first control voltage source 415a, voltage application to the bias potential control terminal 413 by the second control voltage source 415b, and voltage application to the bias potential control terminal 414 by the third control voltage source 415c will be described.

When the parasitic diode 411 is reverse-biased (the parasitic diode 411 is open-circuited and the high-frequency switch is in the "conduction state"), the second control voltage source 415b and the third control voltage source 415c are biased to ground, and the first control voltage source 415a is biased at a withstand voltage of the NMOS transistor 405. Note that a reason for biasing the third control voltage source 415c to ground will be described later. On the other hand, when the parasitic diode 411 is forward-biased (the parasitic diode 411 is short-circuited and the high-frequency switch is in the "cut-off state"), the second control voltage source 415b is biased at a voltage greater than or equal to a threshold voltage of the diode, and the third control voltage source 415c is biased at the withstand voltage of the NMOS transistor 405 and the first control voltage source 415a is biased to ground. By such operation, the same operation as that of the first switching circuit 106a of the first embodiment can be performed.

Next, a reason for controlling a bias potential by the third control voltage source 415c in the above-described operation will be described. In the "conduction state", a voltage between the gate 403 and source 401/drain 402 of the NMOS transistor 405 increases, by which on-resistance is reduced to minimize passage loss. Namely, by biasing the third control voltage source 415c to ground, a voltage between the gate 403 and the drain 402 (or a voltage between the gate 403 and the source 401) can be increased in accordance with a relationship with a voltage applied from the gate control terminal 408.

In addition, in the "cut-off state", by reverse-biasing the back gate 404 which is the P-type semiconductor and the source 401 and the drain 402 which are the N-type semiconductor, PN junction capacitance is reduced, and signal leakage from the source 401 and the drain 402 to the back gate 404 is suppressed, thereby further improving isolation. Namely, by allowing the third control voltage source 415c to have the withstand voltage of the NMOS transistor 405 which is equal to or higher than a bias voltage of the second control voltage source 415b, signal leakage from the source 401 and the drain 402 to the back gate 404 can be suppressed.

Note that the configurations of the resistive elements 409 connected to the source 401 and the drain 402, the bias potential control terminal 414, and the third control voltage source 415c may be applied to the NMOS transistor 105 of the first embodiment.

As described above, according to the high-frequency switch of the second embodiment, the transistor is an NMOS transistor, and the first switching circuit is formed using a parasitic diode formed at a junction surface between an N-well and the back gate; and a control voltage source that controls a bias potential of the parasitic diode, the N-well being used to perform electrical cut-off between a semiconductor substrate and the back gate of the NMOS transistor, and thus, in addition to the advantageous effects of the first embodiment, there is no need to separately dispose a switching circuit, which facilitates the miniaturization of the high-frequency switch.

In addition, the high-frequency switch of the second embodiment includes a source-drain bias control terminal for controlling bias potentials at the source and the drain; and a source-drain bias control voltage source that controls the bias potentials through the source-drain bias control terminal, depending on a conduction or cut-off state of the transistor, and thus, passage loss in the conduction state can be reduced, and isolation upon cut-off can be further improved.

Note that in the invention of the present application, a free combination of the embodiments, modifications to any component of the embodiments, or omissions of any component in the embodiments are possible within the scope of the invention.

INDUSTRIAL APPLICABILITY

As described above, a high-frequency switch according to the invention has a configuration in which a signal between a source and a drain is switched between conduction and cut-off states by a control voltage to a gate, and is suitable for use as a high-frequency switch in a radio communication device.

REFERENCE SIGNS LIST 101, 401, 503: source, 102, 402, 501: drain, 103, 206, 307, 403, 502: gate, 104, 404, 504: back gate, 105, 202, 302, 405: NMOS transistor, 106a, 406a: first switching circuit, 106b, 406b: second switching circuit, 107, 203, 303, 407: high-frequency ground, 108, 408: gate control terminal, 109a, 109b, 409, 410: resistive element, 201, 301: terminal, 204, 304: control voltage source, 205, 305: switching circuit, 306: impedance transformer, 411, 507: parasitic diode, 412, 413: bias potential control terminal, 414: bias potential control terminal (source-drain bias control terminal), 415a: first control voltage source, 415b: second control voltage source, 415c: third control voltage source (source-drain bias control voltage source), 505: N-well, 506: common silicon substrate.

The invention claimed is:

1. A high-frequency switch comprising:
a transistor including a drain, a source, a gate, and a back gate, the transistor performing electrical conduction or cut-off between the drain and the source by controlling a voltage at the gate;
a resistive element disposed between the back gate and a high-frequency ground; and
a first switching circuit to cause a short circuit between the back gate and the high-frequency ground upon the cut-off, the first switching circuit being disposed in parallel with the resistive element between the back gate and the high-frequency ground,
wherein the transistor comprises an NMOS transistor, and the first switching circuit is formed using a parasitic diode formed at a junction surface between an N-well and the back gate, the N-well being used to perform electrical cut-off between a semiconductor substrate and the back gate of the NMOS transistor; and a control voltage source to control a bias potential of the parasitic diode.

2. The high-frequency switch according to claim 1, comprising a second switching circuit to cause a short circuit between the gate and the high-frequency ground upon the cut-off, the second switching circuit being disposed between the gate and the high-frequency ground.

3. The high-frequency switch according to claim 2, comprising:
a source-drain bias control terminal to control bias potentials at the source and the drain; and
a source-drain bias control voltage source to control the bias potentials through the source-drain bias control terminal, depending on a conduction or cut-off state of the transistor.

4. The high-frequency switch according to claim 1, comprising:
a source-drain bias control terminal to control bias potentials at the source and the drain; and
a source-drain bias control voltage source to control the bias potentials through the source-drain bias control terminal, depending on a conduction or cut-off state of the transistor.

* * * * *